United States Patent [19]
Nakajima et al.

[11] Patent Number: 5,815,052
[45] Date of Patent: Sep. 29, 1998

[54] HIGH-FREQUENCY COMPOSITE COMPONENTS COMPRISING FIRST AND SECOND CIRCUITS CONNECTED IN PARALLEL FOR MULTI-FREQUENCY SYSTEMS

[75] Inventors: Norio Nakajima, Takatsuki; Mitsuhide Kato, Siga-ken; Harufumi Mandai, Takatsuki, all of Japan

[73] Assignee: Murata Manufacturing Co., Ltd., Japan

[21] Appl. No.: 655,413

[22] Filed: May 30, 1996

[30]  Foreign Application Priority Data

May 31, 1995  [JP]  Japan .................... 7-134062

[51] Int. Cl.⁶ ................ H03H 7/01; H04B 1/18
[52] U.S. Cl. ............ 333/175; 333/176; 333/185; 455/338
[58] Field of Search ................ 333/125–129, 333/132, 136, 167, 174–176, 185, 134; 455/143, 266, 338

[56] References Cited

U.S. PATENT DOCUMENTS

| | | | |
|---|---|---|---|
| 2,531,419 | 11/1950 | Fox | 333/134 |
| 4,382,238 | 5/1983 | Makimoto et al. | 333/134 |
| 4,910,481 | 3/1990 | Sasaki et al. | 333/134 |
| 5,386,203 | 1/1995 | Ishihara | 333/129 |
| 5,515,015 | 5/1996 | Nakata | 333/134 X |
| 5,525,942 | 6/1996 | Horii et al. | 333/134 |
| 5,561,406 | 10/1996 | Ikata et al. | 333/126 |

FOREIGN PATENT DOCUMENTS

2225501  5/1990  United Kingdom ........... 455/143

*Primary Examiner*—Robert J. Pascal
*Assistant Examiner*—Barbara Summons
*Attorney, Agent, or Firm*—Ostrolenk, Faber, Gerb & Soffen, LLP

[57] ABSTRACT

A high-frequency composite component used for a multi-band system, includes first and second circuits connected in parallel, the first and second circuits having infinite input impedances respectively at first and second frequencies, corresponding to first and second bands. Each of the first and second circuits includes a phase shifter, and a trap circuit connected as a load of the phase shifter. The phase shifter of each of the first and second circuits includes a strip line having a length of $\lambda/4$, wherein $\lambda$ is a wavelength corresponding to one of the first and second frequencies. The trap circuit of each of the first and second circuits includes a series resonance circuit, and the trap circuit resonates at one of the first and second frequencies.

20 Claims, 5 Drawing Sheets

HIGH-FREQUENCY COMPOSITE COMPONENTS COMPRISING FIRST AND SECOND CIRCUITS CONNECTED IN PARALLEL FOR MULTI-FREQUENCY SYSTEMS

BACKGROUND OF THE INVENTION

1. Field of the Invention

The present invention relates to a high-frequency composite component, and more particularly, to a high-frequency composite component, such as a diplexer, for use in mobile terminal units adapted for a plurality of frequencies and a high-frequency composite component including the diplexer.

2. Description of the Related Art

In recent years, mobile terminal units such as portable telephones have spread widely. Such mobile terminal units utilize different frequency bands. Therefore, a multi-band system adapted to a plurality of frequency bands, such as a combination of the PDC (personal digital cellular) system and the PHS (personal handyphone system), both used in Japan, has been considered.

Figure 12:
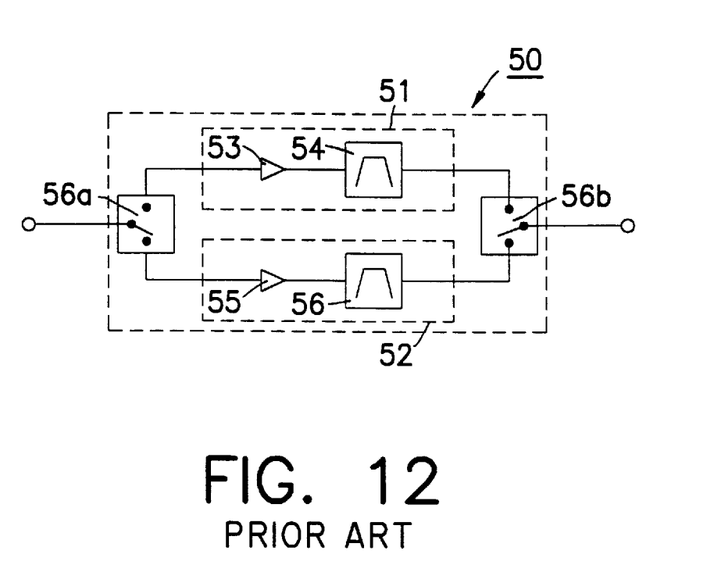
FIG. 12 is a block diagram showing the receiving input circuit for use in a conventional PDC and PHS system.

FIG. 12 is a view showing a configuration of a conventional receiving input circuit 50 used for a multi-band system adapted for the PDC and PHS systems.

In this figure, the PDC receiving input circuit 51 has an 800-MHz-band low-noise amplifier 53 and an 800-MHz-band SAW filter (surface acoustic-wave filter) 54, and the PHS receiving input circuit 52 has a 1.9-GHz-band low-noise amplifier 55 and a 1.9-GHz-band LC filter 56.

In the receiving input circuit 50, switches 56a and 56b select one of the receiving input circuits 51 or 52 based on the frequency of the signal received by an antenna (not shown). Thus, the signal passes through either of the PDC receiving input circuit 51 and the PHS receiving input circuit 52, and a switch 56b, and enters a subsequent circuit (not shown).

However, according to the conventional receiving input circuit 50, signal paths corresponding to the respective frequencies and switches for switching a plurality of frequencies are required. Therefore, there arises a problem that a high-frequency composite component having such a configuration becomes very large. In addition, it is necessary to supply a current to the switches for controlling them, and therefore it is difficult to make power consumption low.

SUMMARY OF THE INVENTION

It is an object of the present invention to overcome the foregoing problems associated with the conventional art and provide a compact, high-frequency composite component having low power consumption.

A high-frequency composite component used for a multi-band system, according to a preferred embodiment of the invention, includes first and second circuits connected in parallel, the first and second circuits having infinite input impedances at first and second frequencies, respectively.

According to one aspect of the invention, each of the first and second circuits includes a phase shifter, and a trap circuit connected to the phase shifter.

According to another aspect of the invention, the phase shifter includes a strip line having a length of λ/4, where λ is a wavelength corresponding to one of the first and second frequencies.

According to another aspect of the invention, the trap circuit includes a resonant circuit and the trap circuit resonates at one of the first and second frequencies.

According to preferred embodiments of the invention, the lengths of the strip lines forming the phase shifters are set such that the impedance of each is infinite at the frequency of the other, under the condition that the trap circuits provide specific load impedances with respect to frequency, for example zero load impedance. Thus, signals can be separated using the phase shifters. Therefore, losses can be made low as compared with those in the conventional high-frequency circuit using switches.

Moreover, switches for switching a plurality of frequencies are not required so that the control current thereof is not needed, so lower power consumption is possible.

For the purpose of illustrating the invention, there are shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention will be explained in detail with reference to the drawings.

Figure 1:
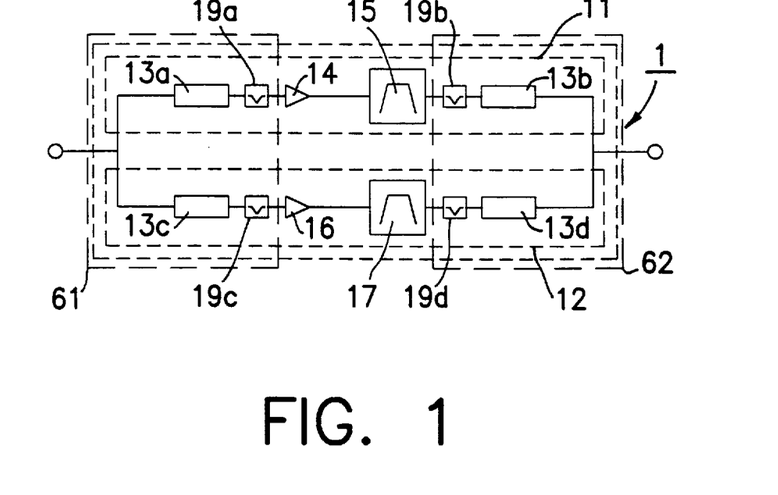
FIG. 1 is a block diagram illustrating a receiving input circuit for use in a multi-band system adapted for the PDC and PHS systems.

FIG. 1 shows a configuration of a receiving input circuit 1, according to a preferred embodiment of the present invention, for use in a multi-band system adapted for the PDC (personal digital cellular) system and the PHS (personal handyphone system). The PDC and PHS systems are communication standards for digital mobile communication and utilize frequencies of 800 MHz and 1.9 GHz, respectively.

The receiving input circuit 1 has a two sub-receiving input circuits 11 and 12 which are connected with each other in parallel. The sub-receiving input circuit 11 is used for the PDC system and includes phase shifters 13a and 13b, trap circuits 19a and 19b, an 800 MHz-band low-noise amplifier 14, and an 800 MHz-band SAW filter (surface acoustic-wave filter) 15. An input of the amplifier 14 is connected to the phase shifter 13a via the trap circuit 19a, and an output of the amplifier 14 is connected to the phase shifter 13b via the SAW filter 15 and the trap circuit 19b. The sub-receiving input circuit 12 is used for the PHS system and includes phase shifters 13c and 13d, trap circuits 19c and 19d, a 1.9 GHz-band low-noise amplifier 16, and a 1.9 GHz-band LC filter 17. An input of the amplifier 16 is connected to the phase shifter 13c via the trap circuit 19c, and an output of the amplifier 16 is connected to the phase shifter 13d via the LC filter 17 and the trap circuit 19d.

The phase shifter 13a and the trap circuit 19a of the sub-receiving input circuit 11 and the phase shifter 13c and the trap circuit 19c of the sub-receiving input circuit 12 constitute a diplexer 61. The phase shifters 13b and 13d and the trap circuits 19b and 19d constitute a diplexer 62.

Figure 2:
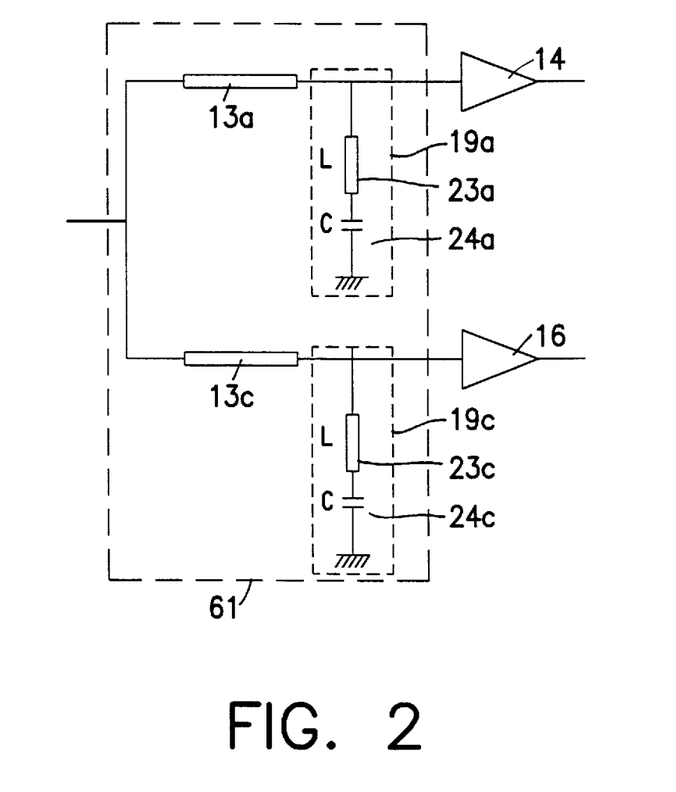
FIG. 2 is a block diagram of the diplexer shown in FIG. 1.

FIG. 2 shows a configuration of the diplexer 61. As shown in FIG. 2, the trap circuit 19a includes, for example, an inductor 23a and capacitor 24a which are connected with each other in series. The inductor 23a and the capacitor 24a constitute a series resonance circuit and the inductance of the inductor 23a and the capacitance of the capacitor 24a are selected so that the trap circuit 19a acts as a band elimination filter eliminating a signal in the 1.9 GHz-band by resonating at the frequency of the 1.9 GHz-band. In the same way, the trap circuit 19c includes an inductor 23c and a capacitor 24c whose inductance and capacitance are selected so that the trap circuit 19c acts as a band elimination filter eliminating a signal in the 800 MHz-band by resonating at the frequency of 800 MHz-band. The phase shifters 13a and 13c are strip lines having a characteristic impedance of 50 Ω, respectively. Moreover, the phase shifter 13a has a length of λ/4, where λ is a wavelength corresponding to the frequency of the 1.9 GHz-band, and the phase shifter 13c has a length of λ/4, where λ is a wavelength corresponding to the frequency of the 800 MHz-band. Although the specific configuration of the diplexer 62 is not explained with reference to a figure, it will be appreciated that the diplexer 62 can be constituted by the same elements as the diplexer 61.

Figure 3:
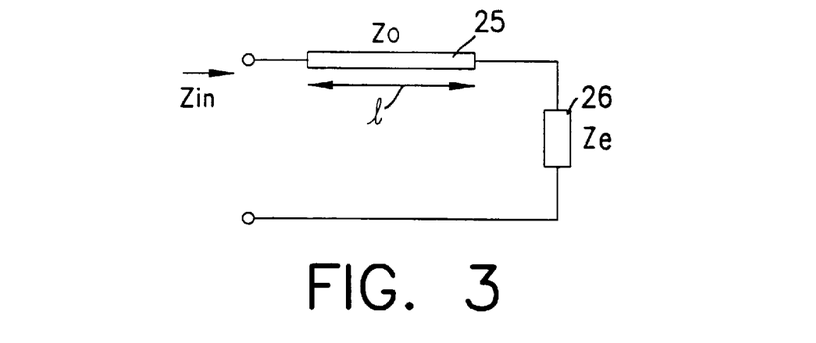
FIG. 3 is an explanatory circuit showing transmission of a signal through a strip line.

Before explaining the function of the diplexer 61, transmission of a signal through a strip line will be explained with reference to FIG. 3. As shown in FIG. 3, in the case where a strip line 25 having a length 1 and a characteristic impedance $Z_0$ is connected to a load 26 having a load impedance $Z_1$, an input impedance $Z_{in}$ changes in response to the load impedance $Z_1$ as shown by the following equation.

$$Z_{in} = Z_0 \frac{Z_1 + jZ_0 \tan\left(2\pi \frac{1}{\lambda}\right)}{Z_0 + jZ_1 \tan\left(2\pi \frac{1}{\lambda}\right)}$$

where the λ is the wavelength of the signal transmitted through the strip line 25.

When the length 1 is set to be λ/4, the equation is expressed as $Z_{in} = Z_0 \cdot (Z_0/Z_1)$. Therefore, $Z_{in}$ becomes infinite in the case of $Z_1 = 0$. This means that all the signals are reflected by the strip line 25.

Referring to FIG. 2 again, when the diplexer 61 receives the signal of the frequency of 800 MHz-band, the load impedance of the trap circuit 19c becomes substantially zero because the trap circuit 19c is so designed that the trap circuit 19c eliminates a signal in the 800 MHz-band by transmitting the signal to ground. In addition, the phase shifter 13c has a length of λ/4, where λ is a wavelength corresponding to a frequency in the 800 MHz-band. As a result, a signal in the 800 MHz-band is reflected by the phase shifter 13c so that the diplexer 61 does not transmit the signal of 800 MHzband to the amplifier 16. In other words, in the diplexer 61, a circuit having the phase shifter 13c and the trap circuit 19c is designed such that the circuit has an input impedance which becomes infinite at the frequency of the 800 MHz-band.

On the other hand, when the diplexer 61 receives the signal of the frequency of 1.9 GHz-band, the load impedance of the trap circuit 19a becomes substantially zero because the trap circuit 19a is so designed that the trap circuit 19a eliminates a signal in the 1.9 GHz-band by transmitting the signal to ground. In addition, the phase shifter 13a has a length of λ/4, where λ is a wavelength corresponding to the frequency of the 1.9 GHz-band. As a result, a 1.9 GHz-band signal is reflected by the phase shifter 13a so that the diplexer 61 does not transmit the 1.9 GHz-band signal to the amplifier 14. In other words, in the diplexer 61, a circuit having the phase shifter 13a and the trap circuit 19a is designed such that the circuit has an input impedance which becomes infinite at the frequency of the 1.9 GHz-band.

Accordingly, in the diplexer 61, either a path connected to the amplifier 14 or a path connected to the amplifier 16 has an infinite input impedance infinite at the frequency of the 800 MHz-band or the 1.9 GHz-band. This means that the diplexer 61 selects one of the paths according to the frequency of the signal transmitted therethrough without physically selecting or switching one path by using a conventional switch. In this way, the diplexer 61 selects one of the amplifier 14 or 16 based on the frequency of the signal which the diplexer 61 receives.

Figure 4:
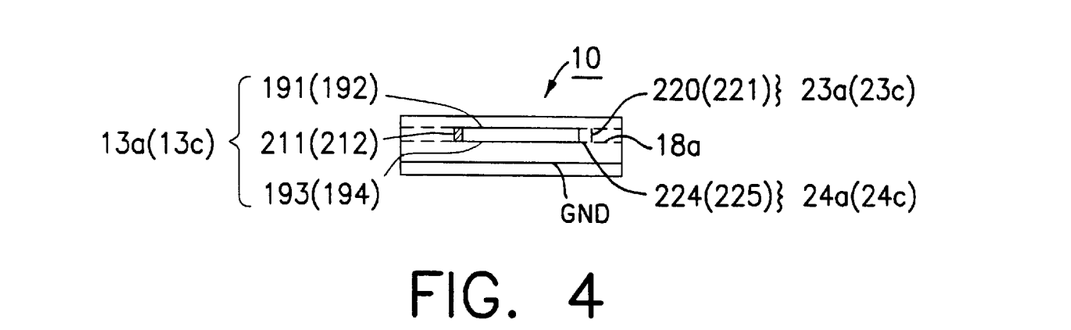
FIG. 4 is a cross-sectional view of a diplexer according to a first embodiment of the present invention.
Figure 5:
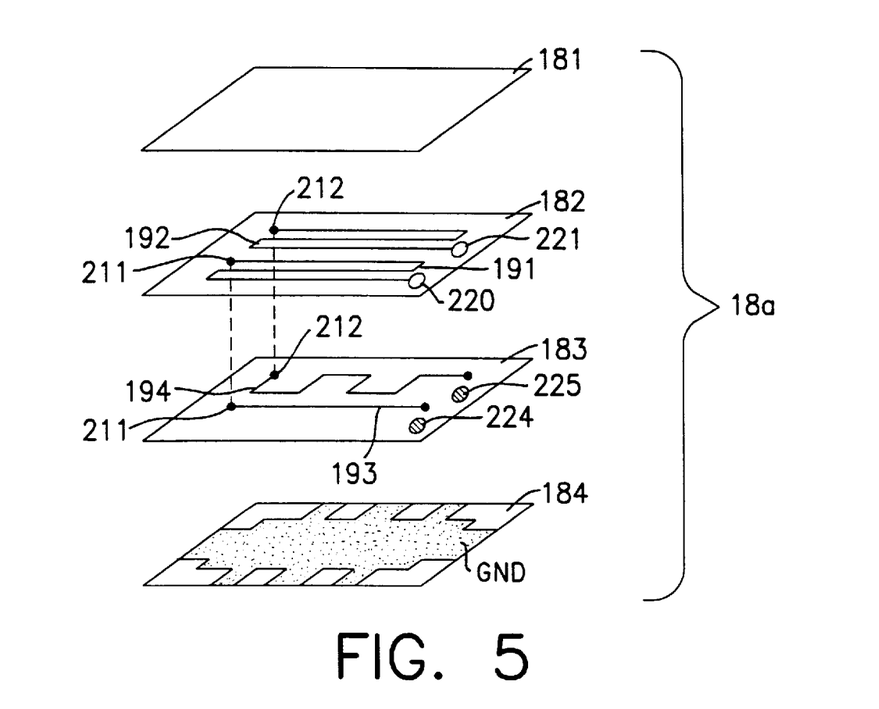
FIG. 5 is an exploded perspective view of the diplexer shown in FIG. 4.

FIG. 4 shows, in part, a cross-sectional view of the diplexer 61, and FIG. 5 is an exploded perspective view of the diplexer 61. The diplexer 61 includes a dielectric multilayer substrate 18a made from ceramics. The phase shifters 13a and 13c are provided as strip lines in the dielectric multilayer substrate 18a. The inductors 23a and 23c and capacitors 24a and 24c are also provided in the dielectric multilayer 18a. As shown in FIGS. 4 and 5, the diplexer 61 is formed by laminating a plurality of dielectric layers 181 to 184 constituting the dielectric multilayer substrate 18a after conductive patterns 191 to 194 and ground electrode GND are made on the surfaces of the dielectric layers 181 to 184 by printing, deposition, lamination, or plating. Moreover, through holes 220 and 221 having a conductive pattern inside thereof and conductive patterns 224 and 225 are also formed by printing, deposition, lamination, or plating.

The strip line constituting the phase shifter 13a is formed by connecting the conductive pattern 191 to the conductive pattern 193 through a via hole 211, as indicated by a dotted line in FIG. 5. The strip line constituting the phase shifter 13c is formed by connecting the conductive pattern 192 to the conductive pattern 194 through a via hole 212, as indicated by a dotted line in FIG. 5. The lengths of the strip lines constituting the phase shifters 13a and 13c are set to be about 15 mm and 35 mm, respectively, in order to provide specific lengths for the respective frequencies. The conductive patterns in the through holes 220 and 221 are connected to ends of the conductive patterns 191 and 192, respectively.

The through holes 220 and 221 and conductive patterns 224 and 225 are so designed that the inductance of the through holes 220 and 221, and the capacitance created by the conductive patterns 224 and 225 and the ground pattern GND constitute the inductors 23a and 23c and the capacitors 24a and 24c for forming band elimination filters for the 1.9 GHz-band and the 800 MHz-band.

In other words, the length of the strip line forming the phase shifter 13a is set such that an input impedance of the phase shifter 13a is infinite at the frequency of the PHS, namely, 1.9 GHz, under the condition that the load impedance of the trap circuit 19a having inductor 23a and capacitor 24a becomes substantially zero. The length of the strip line forming the phase shifter 13c is set such that an input impedance of the phase shifter 13c is infinite at the frequency of the PDC system, namely, 800 MHz, under the condition that the load impedance of the trap circuit 19c having inductor 23c and capacitor 24c becomes substantially zero. It is appreciated that the diplexer 62 can also be constituted by the same elements.

According to the first embodiment, the lengths of the strip lines forming the phase shifters 13a to 13d are set such that the impedances of the phase shifters 13a and 13b are infinite at the frequency of the phase shifters 13c and 13d, under the condition of the trap circuits 19a and 19b providing predetermined load impedances at that frequency, namely, an impedance of zero in these embodiments. Thus, signals can be separated using the phase shifters 13a to 13d. Therefore, losses can be made lower than those in the conventional high-frequency circuit using switches.

Moreover, switches for switching a plurality of frequencies are not required and the control current thereof is not needed, so lower power consumption is possible.

Further, the phase shifters 13a to 13d formed by strip lines, and the trap circuits 19a to 19d, are integrally formed in the dielectric substrate by connecting conductive patterns on the dielectric substrate through via holes. Thus, the phase shifters 13a to 13d and the trap circuits 19a to 19d are made compact. Therefore, the diplexer 61 or a high-frequency composite component including the diplexer 61 is made compact.

Figure 6:
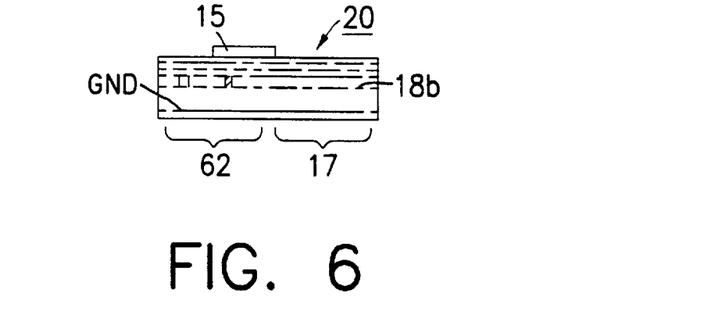
FIG. 6 is a cross-sectional view of a high-frequency composite component according to a second embodiment of the present invention.
Figure 7:
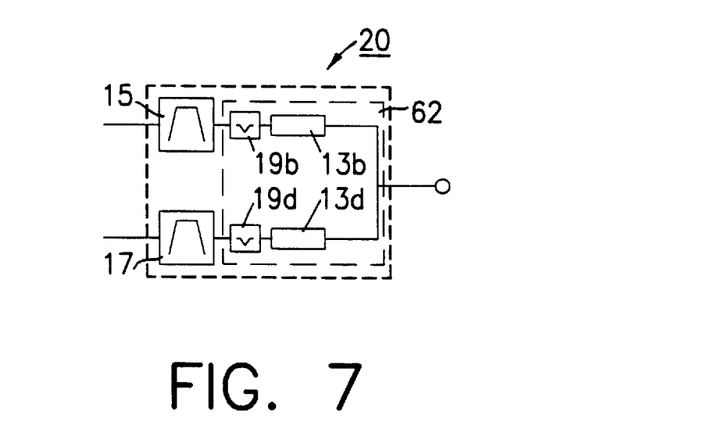
FIG. 7 is a block diagram of the high-frequency composite component shown in FIG. 6.

FIGS. 6 and 7 are a cross-sectional view and a block diagram of a high-frequency composite component according to a second embodiment of the present invention.

A high-frequency composite component 20 has diplexer 62 and a 1.9-GHz-band LC filter 17 all of which are built into a dielectric multilayer substrate 18b, and an 800-MHz-band SAW filter 15 mounted on the dielectric multilayer substrate 18b, among the circuit components which constitute the receiving input circuit 1 in the multi-band system for the PDC and PHS systems shown in FIG. 1.

The high-frequency composite component 20 is formed by making conductive patterns and through holes (not shown) included in the phase shifters 13b and 13d, the trap circuit 19b and 19d, and the 1.9-GHz-band LC filter 17 on each dielectric layer (not shown), laminating the dielectric layers, and mounting the 800-MHz-band SAW filter 15 on the dielectric multilayer substrate 18b. The phase shifters 13b and 13d and the trap circuit 19b and 19d are formed in the same way as in the first embodiment.

Figure 8:
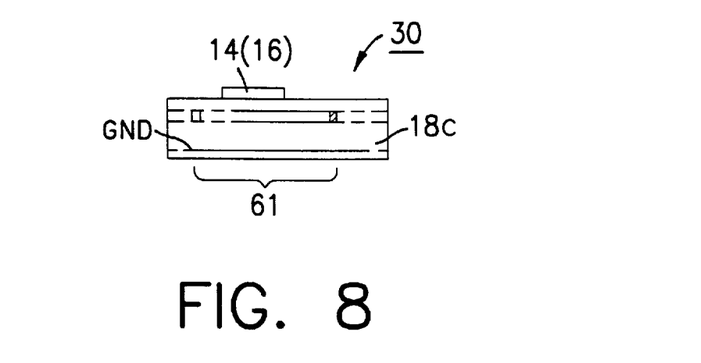
FIG. 8 is a cross-sectional view of a high-frequency composite component according to a third embodiment of the present invention.
Figure 9:
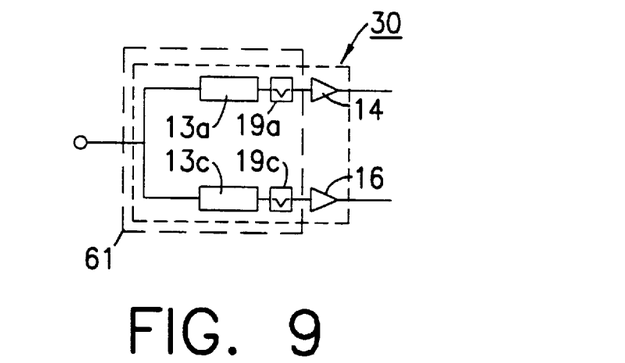
FIG. 9 is a block diagram of the high-frequency composite component shown in FIG. 8.

FIGS. 8 and 9 are a cross-sectional view and a block diagram of a high-frequency composite component according to a third embodiment of the present invention.

A high-frequency composite component 30 has diplexer 61 built into a dielectric multilayer substrate 18c, an 800-MHz-band low-noise amplifier 14, and a 1.9-GHz-band low-noise amplifier 16 both of which are mounted on the dielectric multilayer substrate 18c, among the circuit components which are included in the receiving input circuit 1 in the multi-band system for the PDC and PHS systems shown in FIG. 1.

The high-frequency composite component 30 is formed by making conductive patterns and through holes (not shown) constituting diplexer 61 on each dielectric layer (not shown), laminating the dielectric layers, and mounting the 800-MHz-band low-noise amplifier 14 and the 1.9-GHz-band low-noise amplifier 16 on the dielectric multilayer substrate 18c. The diplexer 61 is formed in the same way as in the first embodiment.

According to the second and third embodiments, since either the diplexer 62 or the diplexer 61 is built into either one of the dielectric multilayer substrates 18b and 18c, and in addition, the 1.9-GHz-band LC filter 17 is built into the dielectric multilayer substrate 18b and 18c, and the 800-MHz-band low-noise amplifier 14, the 800-MHz-band SAW filter 15, and the 1.9-GHz-band low-noise amplifier 16 are mounted on the dielectric multilayer substrates 18b and 18c, the signal transfer path from the antenna can be made short. Therefore, signal losses can be reduced.

Moreover, the high-frequency composite components 20 and 30 constituting the receiving input circuit 10 in the multi-band system for the PDC and PHS systems can be made compact. Therefore, the receiving input circuit 10 can also be reduced in size.

Figure 10:
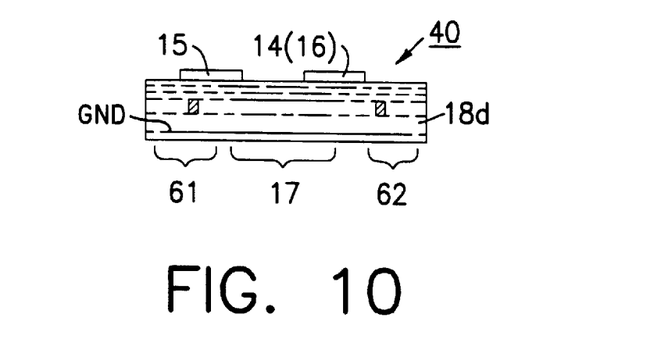
FIG. 10 is a cross-sectional view of a high-frequency composite component according to a fourth embodiment of the present invention.

FIG. 10 is a cross-sectional view of a high-frequency composite component according to a fourth embodiment of the present invention. The corresponding block diagram is the same as that shown in FIG. 1.

A high-frequency composite component 40 is a combination of the high-frequency composite components according to the second and third embodiments. The high-frequency composite component 40 has the diplexers 61 and 62, the 1.9-GHz-band LC filter 17, the 800-MHz-band SAW filter 15, the 800-MHz-band low-noise amplifier 14, and the 1.9-GHz-band low-noise amplifier 16. The diplexers 61 and 62 and the LC filter 17 are in the dielectric multilayer substrate 18d, and the SAW filter 15 and the amplifiers 14 and 16 are mounted on the dielectric multilayer substrate 18d.

The high-frequency composite component 40 is formed by making conductive patterns (not shown) and through holes constituting the diplexers 61 and 62 and the 1.9-GHz-band LC filter 17 on each dielectric layer (not shown), laminating the dielectric layers, and mounting the 800-MHz-band SAW filter 15, the 800-MHz-band low-noise amplifier 14, and the 1.9-GHz-band low-noise amplifier 16 on the dielectric multilayer substrate 18d. The phase shifters 13a to 13d are formed in the same way as in the first embodiment.

According to the fourth embodiment, since all circuit components constituting the receiving input circuit 1 in the multi-band system for the PDC and the PHS systems are built into the dielectric multilayer substrate 18d or mounted on the dielectric multilayer substrate 18d, the signal transfer path from the antenna can be made even shorter. Therefore, signal losses can be reduced even more.

The high-frequency composite component 40 constituting the receiving input circuit 10 in the multiband system is also made more compact. Therefore, the receiving input circuit 10 is further reduced in size.

Figure 11:
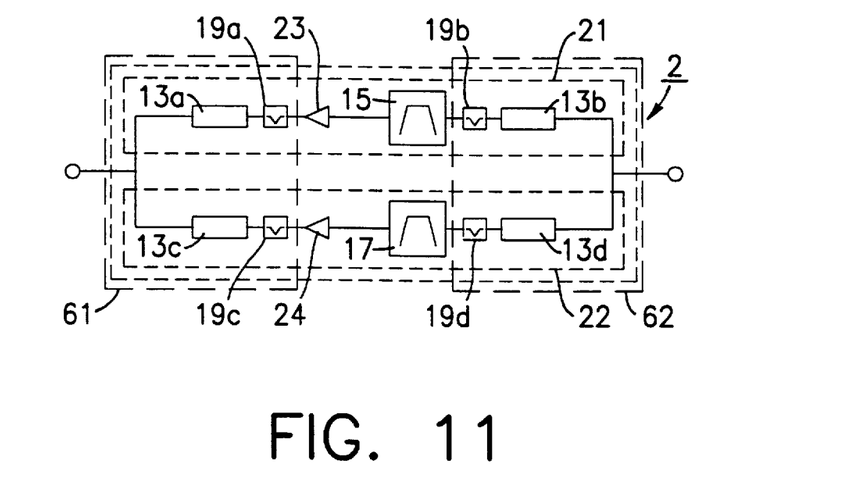
FIG. 11 is a block diagram showing a transmitting output circuit for use in a multi-band system adapted for the PDC and PHS systems.

In each of the above embodiments, a receiving input circuit has been described. In addition, FIG. 11 shows a transmitting output circuit 2 for a multi-band system for the PDC and PHS systems, in which the same advantages are obtained.

The transmitting output circuit 2 has the diplexers 61 and 62 described above. The PDC transmitting output circuit 21 includes an 800-MHz-band high-output amplifier 23, and the 800-MHz-band SAW filter 15. The PHS transmitting output circuit 22 includes a 1.9-GHz-band high-output amplifier 24 and the 1.9-GHzband LC filter 17.

Although the strip lines are embedded in the dielectric multilayer substrate in the aforementioned examples, the strip lines may also be formed on the dielectric substrate. Moreover, the trap circuit, which acts as a band elimination filter in these examples, may be constituted by a circuit other than the circuit shown in FIG. 2.

Circuit components designed for the PDC and PHS systems have been described. The present invention can also be applied to circuit components for use in another type of multi-band system, such as a voltage-controlled oscillator or a frequency converter.

While preferred embodiments of the invention have been disclosed, various modes of carrying out the principles disclosed herein are contemplated as being within the scope of the following claims. Therefore, it is understood that the scope of the invention is not to be limited except as otherwise set forth herein.

What is claimed is:

1. A hiqh-frequency composite component for use in a multi-frequency system, comprising first and second circuits connected in parallel, the first circuit having substantially infinite input impedance at a first frequency whereby said first frequency is passed by said second circuit, and the second circuit having substantially infinite input impedance at a second frequency whereby said second frequency is passed by said first circuit;

wherein said first circuit includes a first phase shifter and a first trap circuit connected as a load of said first phase shifter, said first phase shifter providing said substantially infinite input impedance at said first frequency, and said first trap circuit providing substantially zero load impedance at said first frequency; and wherein said second circuit further includes an amplifier and a bandpass filter for said first frequency.

2. A hi-frequency composite component according to claim 1, wherein said second circuit includes a second phase shifter and a second trap circuit connected as a load of said second phase shifter, said second phase shifter providing said substantially infinite input impedance at said second frequency, and said second trap circuit providing substantially zero load impedance at said second frequency.

3. A high-frequency composite component according to claim 2, wherein said second phase shifter is a $\lambda/4$ stripline.

4. A high-frequency composite component according to claim 2, wherein said first phase shifter is a $\lambda/4$ stripline.

5. A high-frequency composite component for use in a multi-frequency system, comprising first and second circuits connected in parallel, the first circuit having substantially infinite input impedance at a first frequency whereby said first frequency is passed by said second circuit, and the second circuit having substantially infinite input impedance at a second frequency whereby said second frequency is passed by said first circuit, wherein said first circuit includes a first phase shifter and a first trap circuit connected as a load of said first phase shifter, said first phase shifter providing said substantially infinite input impedance at said first frequency, and said first trap circuit providing substantially zero load impedance at said first frequency; and wherein said second circuit includes a second phase shifter and a second trap circuit connected as a load of said second phase shifter, said second phase shifter providing said substantially infinite input impedance at said second frequency, and said second trap circuit providing substantially zero load impedance at said second frequency, wherein said second circuit further includes an amplifier and a bandpass filter for said first frequency.

6. A high-frequency composite component according to claim 5, wherein said first phase shifter is a $\lambda/4$ stripline.

7. A high-frequency composite component according to claim 6, wherein said second phase shifter is a $\lambda/4$ stripline.

8. A high-frequency composite component according to claim 5, wherein said second phase shifter is a $\lambda/4$ stripline.

9. A high-frequency composite component for use in a multi-frequency system, comprising first and second circuits connected in parallel, the first circuit having substantially infinite input impedance at a first frequency whereby said first frequency is passed by said second circuit, and the second circuit having substantially infinite input impedance at a second frequency whereby said second frequency is passed by said first circuit;

wherein said first circuit includes a first phase shifter and a first trap circuit connected as a load of said first phase shifter, said first phase shifter providing said substantially infinite input impedance at said first frequency, and said first trap circuit providing substantially zero load impedance at said first frequency; and wherein said first circuit further includes an amplifier and a bandpass filter for said second frequency.

10. A high-frequency composite component according to claim 9, wherein said first phase shifter is a $\lambda/4$ stripline.

11. A high-frequency composite component for use in a multi-frequency system, comprising first and second circuits connected in parallel, the first and second circuits having infinite input impedance at first and second frequencies, respectively;

wherein each of the first and second circuits includes a Phase shifter, and a trap circuit connected as a load of the phase shifter;

wherein each said phase shifter and trap circuit are formed on at least one layer in a multilayer laminated dielectric substrate.

wherein said first and second circuits further comprise amplifiers for said second and first frequencies, respectively, said amplifiers being mounted on an outer portion of said substrate.

12. A high-frequency composite component according to claim 11, wherein said second circuit further comprises a filter for said first frequency, and said filter for said first frequency is an LC filter.

13. A high-frequency composite component according to claim 12, wherein said first circuit further comprises a filter for said second frequency, and said filter for said second frequency is an SAW filter.

14. A high-frequency composite component according to claim 11, wherein said first and second circuits further comprise filters for said second and first frequencies, respectively, said filter for said first frequency being formed on at least one layer in said substrate, said filter for said second frequency being mounted on an outer portion of said substrate.

15. A high-frequency composite component according to claim 11, wherein said first circuit further comprises a filter for said second frequency, and said filter for said second frequency is an SAW filter.

16. A high-frequency composite component for use in a multi-frequency system, comprising first and second circuits connected in parallel, the first and second circuits having infinite input impedance at first and second frequencies, respectively;

wherein each of the first and second circuits includes a phase shifter, and a trap circuit connected as a load of the phase shifter;

wherein each said phase shifter and trap circuit are formed on at least one layer in a multilayer laminated dielectric substrate;

wherein said first circuit further comprises a filter for said second frequency, and said second circuit further comprises a filter for said first frequency, said filter for said first frequency being formed on at least one layer in said substrate, said filter for said second frequency being mounted on an outer portion of said substrate.

17. A high-frequency composite component according to claim 16, wherein said filter for said first frequency is an LC filter.

18. A high-frequency composite component according to claim 17, wherein said filter for said second frequency is an SAW filter.

19. A high-frequency composite component according to claim 16, wherein said first and second circuits further comprise amplifiers for said second and first frequencies, respectively, said amplifiers being mounted on an outer portion of said substrate.

20. A high-frequency composite component according to claim 16, wherein said filter for said second frequency is an SAW filter.

* * * * *